United States Patent
Lust et al.

(10) Patent No.: US 7,379,486 B2
(45) Date of Patent: May 27, 2008

(54) TECHNIQUE FOR OPTICALLY PUMPING ALKALI-METAL ATOMS USING CPT RESONANCES

(75) Inventors: Lisa M. Lust, Plymouth, MN (US); Douglas R. Carlson, Woodbury, MN (US); Daniel W. Youngner, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 97 days.

(21) Appl. No.: 11/161,094

(22) Filed: Jul. 22, 2005

(65) Prior Publication Data
US 2007/0076776 A1    Apr. 5, 2007

(51) Int. Cl.
*H01S 3/091*    (2006.01)

(52) U.S. Cl. .................... 372/70; 372/26; 372/27; 372/29.011; 372/69; 372/71

(58) Field of Classification Search ............. 372/69–72
See application file for complete search history.

(56) References Cited

U.S. PATENT DOCUMENTS

| | | | |
|---|---|---|---|
| 4,446,428 A | 5/1984 | Kwon et al. | |
| 4,450,407 A | 5/1984 | Kwon et al. | |
| 4,454,482 A | 6/1984 | DeMarchi | |
| 5,107,226 A | 4/1992 | Pascaru | |
| 5,387,881 A | 2/1995 | Schweda et al. | |
| 5,657,340 A | 8/1997 | Camparo et al. | |
| 6,255,647 B1 | 7/2001 | Vanier et al. | |
| 6,263,002 B1 | 7/2001 | Hsu et al. | |
| 6,265,945 B1 | 7/2001 | Delaney et al. | |
| 6,320,472 B1 | 11/2001 | Vanier | |
| 6,347,108 B2 | 2/2002 | Jiang et al. | |
| 6,597,228 B1 * | 7/2003 | Reichel | 327/330 |
| 6,900,702 B2 | 5/2005 | Youngner et al. | |
| 7,102,451 B2 | 9/2006 | Happer et al. | 331/94.1 |
| 2001/0021214 A1 | 9/2001 | Jiang et al. | |

OTHER PUBLICATIONS

Kitching et al, "Optical-pumping noise in laser-pumped, all-optical microwave frequency references" J. Opt. Soc. Am. B/vol. 18, No. 11, Nov. 2001.*

(Continued)

*Primary Examiner*—Minsun Oh Harvey
*Assistant Examiner*—Yuanda Zhang (57) ABSTRACT

Systems and methods for optically pumping alkali-metal atoms using Coherence Population Trapping (CPT) resonances are disclosed. An illustrative push-pull optical pumping system for inducing CPT resonances in a resonance cell containing an admixture of alkali-metal atoms and one or more buffer gasses may include a laser assembly adapted to produce alternating orthogonally polarized light, and at least one DC current source adapted to output a constant-intensity carrier current signal for inducing laser emission from the laser assembly at a carrier wavelength of the alkali-metal atoms. An RF modulated signal outputted from an RF modulation source can be rectified, split, and phase-shifted for inducing a time-dependent polarization of the laser light that can be used to enhance CPT resonances. The alternating orthogonally polarized light from the laser assembly can then be used to optically pump the alkali-metal atoms within the vapor cavity, producing a dark state that can be detected with a photodetector or the like.

20 Claims, 7 Drawing Sheets

OTHER PUBLICATIONS

Arinmondo et al., "Nonabsorbing Atomic Coherences by Coherent Two-Photon Transitions in a Three-Level Optical Pumping," Lettere Al Nuovo Cimento Della Societa Italiana Di Fisica, vol. 17, No. 10, 8 pages, Nov. 6, 1976.

Jau et al., "Push-Pull Optical Pumping of Pure Superposition States," Physical Review Letters, vol. 93, No. 16, 4 pages, Oct. 2004.

Kitching et al., IEEE Transactions on Instrumentation and Measurement, vol. 49, No. 6, pp. 1313-1317, Dec. 2000.

Zanon et al., "Observation of Ramsey Fringes with Optical CPT Pulses", Proceedings of the 18th European Frequency and Time Forum, University of Surrey, Guildford, UK, 2004 (Instution of Electrical Engineers, London, 2004).

* cited by examiner

TECHNIQUE FOR OPTICALLY PUMPING ALKALI-METAL ATOMS USING CPT RESONANCES

GOVERNMENT SUPPORT

This invention was made with government support under DARPA contract number N66001-02-C-8019. The government may have certain rights in the invention.

FIELD

The present invention relates generally to the field of atomic frequency standards. More specifically, the present invention pertains to techniques for optically pumping alkali-metal atoms using Coherent Population Trapping (CPT) resonances.

BACKGROUND

Atomic frequency standards are used in a number of applications demanding a high level of accuracy and precision in time keeping. In communications and navigational systems, for example, such atomic frequency standards are often used in atomic clocks as a means to maintain the long-term frequency stability necessary to accurately guide satellites, missiles, aircraft, or other objects through space. In positioning systems such as a Global Positioning System (GPS), such atomic frequency standards are often used in atomic clocks to coordinate the positioning of multiple GPS satellites in orbit. A slight variation in time measured by each GPS satellite can cause significant positioning errors in the guidance system used by many communications and navigational systems, affecting the ability of the system to accurately guide objects through space.

An atomic clock uses the principle of atomic energy transition to output a reference frequency that is relatively insensitive to vibration, shock, or other such noise. In a typical intensity-based atomic frequency standard using an alkali-metal such as cesium 133 or rubidium 85 or 87 as the source of resonance atoms, the energy states of the source atoms are often prepared by optically pumping a resonance cell containing an admixture of the alkali-metal atoms and one or more buffer gases. The intensity of a laser source such as a diode laser is then used to achieve the desired optical pumping.

More recent developments in the art have focused on the use of Coherent Population Trapping (CPT) resonances to prepare the energy states of the alkali-metal atoms. CPT is a nonlinear phenomenon in atoms in which coherences (i.e. electromagnetic multipole moments) between atomic energy levels are excited by pairs of radiation fields. Instead of controlling the intensity of the laser source to achieve the desired optical pumping, CPT systems typically rely on modulated light in order to induce resonances in the alkali-metal atoms, causing coherent optical pumping to occur from two hyperfine ground states to an excited state, commonly referred to as the lambda ($\Lambda$)transition. CPT systems thus rely on the coherence property of the laser source, and not its intensity, to accomplish the optical pumping.

For conventional optical pumping techniques using CPT, the radiation fields are usually generated by two lasers phase-locked to each other, or from the sideband of a single laser modulated at a sub-harmonic frequency of the alkali-atom hyperfine frequency. The effect of the laser radiation is to produce a strong coherence in the ground state at the hyperfine frequency, thus inhibiting all transitions to the excited "P" state. At the exact resonance, no transitions take place from the ground state to the excited P state, and no energy is absorbed from the laser radiation by means of transitions.

To increase the signal-to-noise (SNR) ratio of the system, the CPT resonances induced within the resonance cell may be enhanced by directing alternating left and right-handed circularly polarized light ($\sigma^+$, $\sigma^-$) into the cell. Such "push-pull" optical pumping allows a greater amount of the alkali-metal atoms within the resonance cell to be pumped into the important 0-0 superposition state, thus producing nearly pure, coherent superposition states. This ability to enhance CPT resonances has widespread implications in the performance of atomic clocks, laser systems, maser systems, or other such systems that utilize highly accurate atomic frequency standards to measure time.

While push-pull optical pumping is capable of producing CPT resonances several magnitudes greater than more conventional optical pumping schemes, such technique often requires additional components that are not readily miniaturized for compact systems such as microelectromechanical systems (MEMS). MEMS-based systems are typically created using semiconductor fabrication techniques by etching various components onto the surface of a silicon or glass wafer, forming structures that are often several times smaller than their non-MEMS counterparts. As a result, components such as a Mach-Zehnder intensity modulator and/or an interferometer, which are not readily miniaturized for a given wavelength, are therefore difficult to implement in smaller-scale systems such as MEMS.

SUMMARY

The present invention relates to systems and methods for push-pull optically pumping alkali-metal atoms using Coherent Population Trapping (CPT) resonances. A push-pull optical pumping system in accordance with an illustrative embodiment of the present invention may include a vapor cavity containing a source of alkali-metal atoms and one or more buffer gasses, and a laser assembly including at least two orthogonally polarized laser sources adapted to produce alternating linearly polarized light. A DC current source operatively connected to a servo mechanism can be configured to output a carrier current signal having a substantially constant intensity, inducing laser emission from the laser sources at a wavelength corresponding to the carrier wavelength of the alkali-metal atoms. An RF modulation source adapted to output an RF signal for modulating the carrier current signal can be used to induce sidebands on the carrier current signal separated by the hyperfine transition of the alkali-metal atoms. The RF modulated signal can be split, rectified, and phase-shifted such that the second laser source is modulated 180° out-of-phase with the first laser source, producing alternating pulses of orthogonally polarized light that can be used to optically pump the alkali-metal atoms into a CPT state. A photodetector or other suitable means for sensing the transmission of laser light through the vapor cavity can then be utilized to detect the presence of dark states in the broad absorption resonance.

DETAILED DESCRIPTION

The following description should be read with reference to the drawings, in which like elements in different drawings are numbered in like fashion. The drawings, which are not necessarily to scale, depict selected embodiments and are not intended to limit the scope of the invention. Although examples of construction, dimensions, and materials are illustrated for the various elements, those skilled in the art will recognize that many of the examples provided have suitable alternatives that may be utilized.

Figure 1:
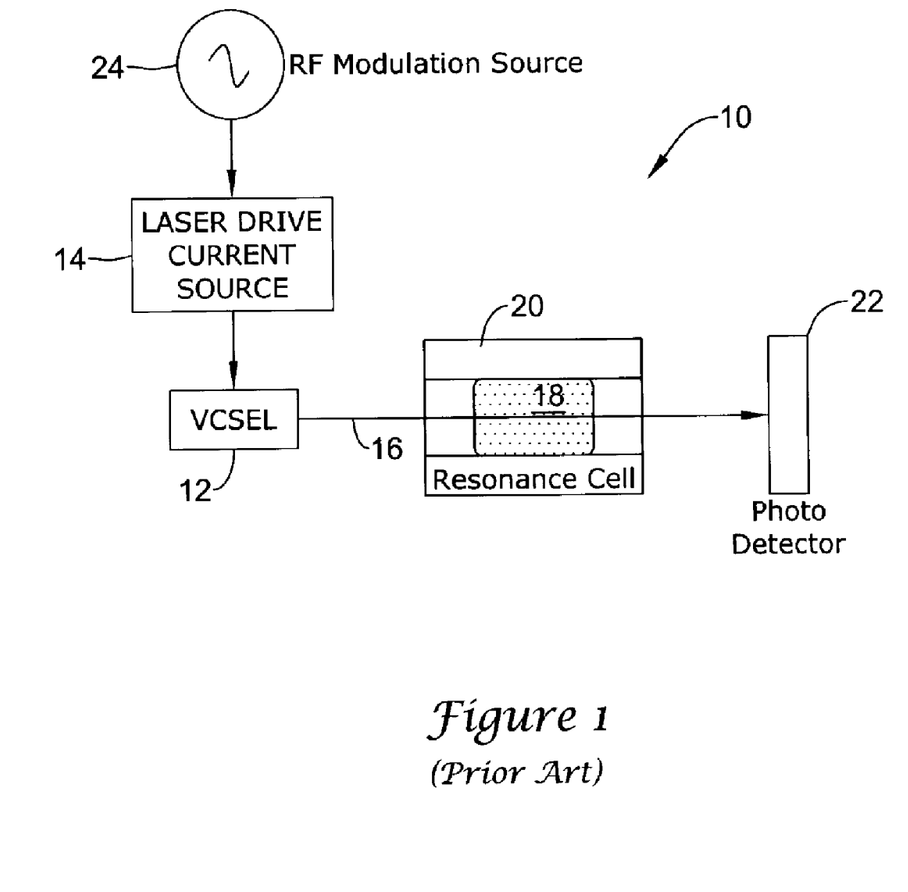
FIG. 1 is a diagrammatic view showing a conventional optical pumping system for inducing CPT resonances in alkali-metal atoms using a single laser source.

FIG. 1 is a diagrammatic view showing a conventional optical pumping system 10 for inducing CPT resonances in alkali-metal atoms using a single laser source. As shown in FIG. 1, a laser source 12 such as a vertical cavity surface emitting laser (VCSEL) can be powered with a laser drive current source 14 to produce a radiation field 16 that is directed into the vapor cavity 18 of a resonance cell 20 containing an admixture of alkali-metal atoms and a buffer gas. A photodetector 22 in line with the radiation field 16 can then be utilized to measure the transmission of radiation through the vapor cavity 18.

Figure 2:
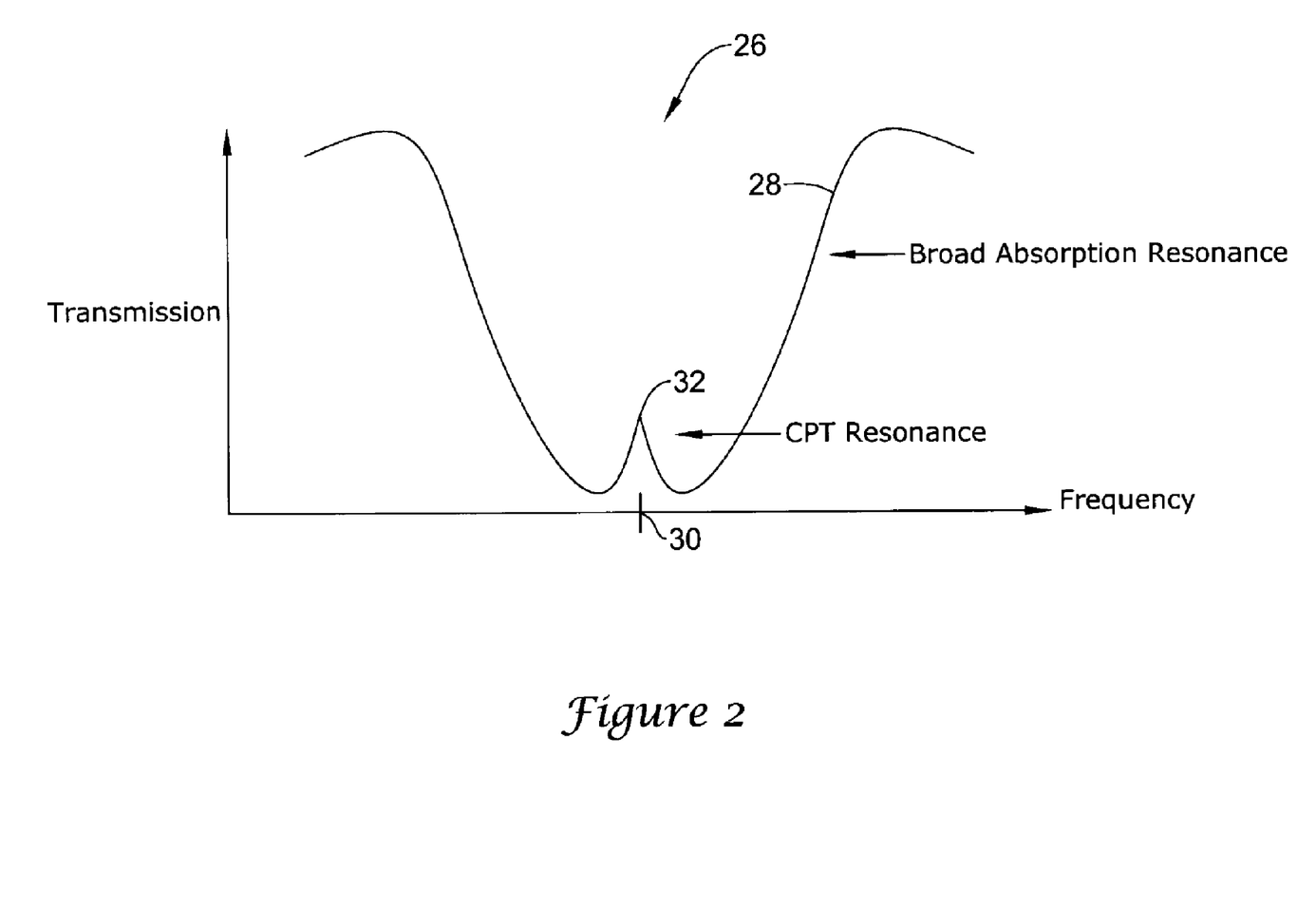
FIG. 2 is a chart showing the level of radiation transmission vs. frequency for the optical pumping system of FIG. 1.

An RF sinusoidal modulation source 24 coupled to the laser drive current source 14 can be provided to vary the light intensity of the laser source 12 in order to induce sidebands that match the hyperfine transition spacing of the alkali-metal atoms contained within the vapor cavity 18. As can be further seen in FIG. 2, which illustrates a chart 26 showing the transmission of light though the vapor cavity 18 as a function of frequency, such sidebands produce a broad absorption resonance 28 in the transmission spectrum due to the excitation of the alkali-metal atoms from their hyperfine ground states to their excited P states. At the exact hyperfine frequency 30, a "dark state" in the broad absorption resonance 28 occurs, which as indicated generally by reference number 32 in FIG. 2, is detected by the photodetector 22 as a dark line in the transmission spectrum. Such "dark state" is characterized by the presence of a ground-state coherence out-of-phase with the driving radiation field 16 such that further excitation of the alkali-metal atoms within the vapor cavity 18 is suppressed.

In the illustrative optical pumping system 10 of FIG. 1, the drive current emitted from the laser drive current source 14 must be modulated with the RF modulation source 24 in order to vary the intensity of the radiation field 16 at a given carrier wavelength. In some designs, such modulation is accomplished with components such as a Mach-Zehnder intensity modulator, which works to split the input beam to generate on-off sub-beams that produce an optical phase retardation in one sub-beam, and an equal and opposite phase retardation in the other beam. The split beams are then recombined and made to interfere to produce amplitude modulated light, which can be converted to light of alternating polarization using a Michelson interferometer.

While such additional components are capable of producing alternating laser light for inducing the desired CPT resonances in the alkali-metal atoms, such components are not easily fabricated on small-scale devices such as MEMS devices. As a result, the optical pumping system 10 may be limited to those applications where reduced size and low power consumption are not critical. In some applications, the inability to miniaturize all of the components for the optical pumping system 10 may prevent the incorporation of such system 10 in other MEMS devices employing atomic frequency standards.

Figure 3:
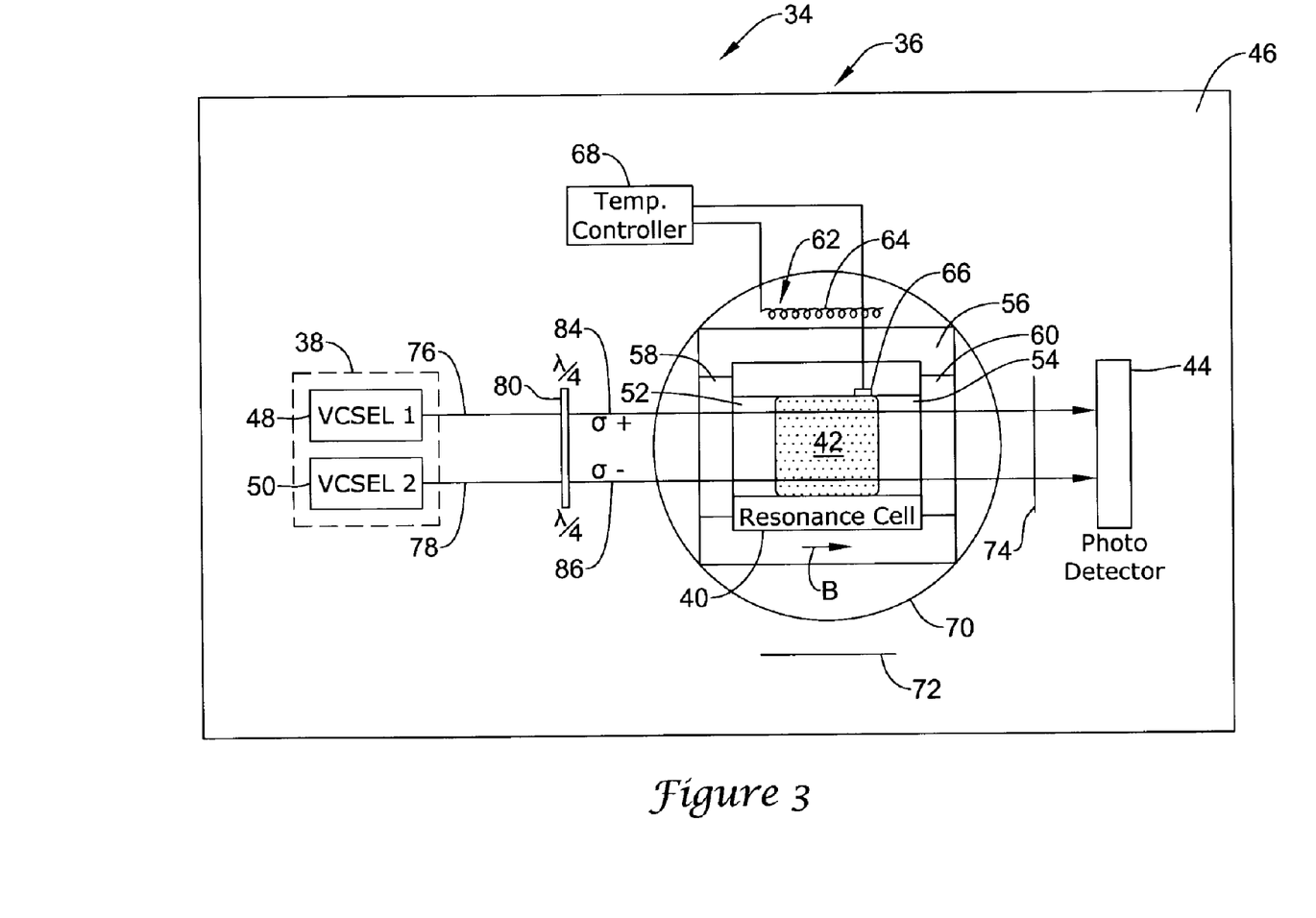
FIG. 3 is a diagrammatic view showing an illustrative push-pull optical pumping system for inducing CPT resonances in alkali-metal atoms in accordance with an exemplary embodiment of the present invention.

Referring now to FIG. 3, a diagrammatic view showing an illustrative push-pull optical pumping system 34 for inducing CPT resonances in alkali-metal atoms will now be described. As shown in FIG. 3, an optical package 36 of the system 34 may house a number of components including a laser assembly 38 for producing alternating orthogonally polarized laser light, a sealed resonance cell 40 including a vapor cavity 42 containing alkali-metal atoms and one or more buffer gasses, and a photodetector 44 or other suitable device for sensing the transmission of laser light through the vapor cavity 42.

An underlying frame 46 of the optical package 36 can be provided to secure each of the individual optical components of the package 36 in proper optical alignment with respect to each other. The underlying frame 46 may be constructed from a thermally stable material suitable for housing the elements of the optical package 36 without damage or distortion of their optical properties. In those embodiments in which the optical pumping system 34 is adapted for use in MEMS-type devices, the frame element 46 may comprise a support substrate of silicon, glass, or other suitable material that can be fabricated using semiconductor fabrication techniques. While only the optical components used for optically pumping the alkali-metal atoms are shown in FIG. 3, it should be understood that other components could also be attached to and/or fabricated on the underlying frame 46. If, for example, the optical pumping system 34 is to be used as an atomic frequency standard for a MEMS-type laser guidance system, other components such as gyroscopes and/or accelerometers could also be fabricated on the underlying frame 46, if desired.

The laser assembly 38 may include at least two orthogonally polarized laser sources 48,50 capable of producing alternating linearly polarized laser light at a specific carrier wavelength of the alkali-metal atoms. A suitable laser source for producing laser light at such wavelengths may comprise a diode laser such as a vertical cavity surface emitting laser (VCSEL). In addition to their compact size and low power consumption, VCSEL's can be fabricated onto the surface of the underlying frame 46 using bulk semiconductor fabrication techniques, making such devices particularly suited for MEMS-type devices. In certain embodiments, the laser assembly 38 may include arrays of VCSEL's, which can be configured such that only one array is operative at any particular time. In use, each VCSEL within the array may provide a level of redundancy to the optical pumping system 34, thus ensuring that a failure of one or more of the VCSEL's in the array does not render the entire system 34 inoperative.

While at least two orthogonally polarized VCSEL's 48,50 may be used to provide alternating laser radiation at a particular carrier wavelength, it should be understood that other suitable laser sources capable of exciting CPT resonances in the alkali-metal atoms could also be utilized. An example of an alternative laser source may include a Distributed Bragg Reflector (DBR), which uses a gallium-arsenic (GaAs) semiconductor laser diode to produce laser radiation. The type of laser source utilized will depend on several design considerations, including energy consumption, size, and ease of manufacturing. In some embodiments, a single, dual-polarized VCSEL may be employed to provide the alternating orthogonally polarized laser light for inducing the CPT resonances.

The resonance cell 40 can be fabricated from a suitable glass material such as Pyrex®, and may contain one or more buffer gases that can be mixed to produce a zero temperature coefficient within the vapor cavity 42. Examples of suitable buffer gasses that can be used may include, but are not limited to, argon, krypton, neon, and xenon. The type of buffer gas or gasses used will typically depend on factors such as the temperature and pressure within the vapor cavity 42 as well as the type of alkali-metal atoms used. Other factors may also affect the choice of buffer gasses used, however. In some embodiments, the interior surface of the resonance cell 40 can be coated with an inert coating such as paraffinic wax or polytetrafluoroethylene (PTFE), which functions to prevent wall relaxation of the alkali atoms as they contact the inner wall surface of the vapor cavity 42.

A number of window apertures 52,54 permit laser light to enter and exit the vapor cavity 42, allowing the laser radiation to pass through the resonance cell 40 and to the photodetector 44. The window apertures 52,54 may comprise an optically transparent material such as glass, fused silica, quartz, and/or sapphire, which permits the laser radiation to pass through the apertures 52,54 without a shift in the hyperfine frequency. To prevent quenching of the scattered radiation within the vapor cavity 42, the introduction of gasses such as nitrogen or methane should normally be avoided during the fabrication process.

The resonance cell 40 can be surrounded by or encased within a temperature-stabilized thermal enclosure 56 made of a high thermal conductivity material for maintaining the temperature within the vapor cavity 42 at a constant. In certain embodiments, for example, the thermal enclosure 56 may comprise an oven equipped with a number of optically transparent openings 58,60 for permitting laser radiation to be transmitted through the resonance cell 40 to the photodetector 44, and a heating element 62 for heating the thermal enclosure 56. The optically transparent openings 58,60 may be formed from materials similar to that used in the window apertures 52,54 for the resonance cell 40, including, for example, glass, fused silica, quartz, and/or sapphire. The heating element 62, in turn, may comprise a wire winding, a power transistor in heat dissipation mode, or other suitable means for providing heat to the thermal enclosure 56. In the illustrative embodiment of FIG. 3, for example, a wire winding 64 disposed about all or a portion of the thermal enclosure 56 can be energized to heat the thermal enclosure 56 when the temperature within the vapor cavity 42 falls below a certain temperature. A temperature sensor 66 can be utilized to provide feedback to a temperature controller 68, which regulates the current through the wire winding 64 to maintain the alkali-metal atoms at a desired temperature within the vapor cavity 42.

A number of Helmholtz coils, solenoids, and/or magnetic materials 70,72,74 can be configured to produce a homogenous magnetic field B in the direction of the laser radiation that provides an axis of quantization to the atomic ensemble. The magnetic field B produced by the coils, solenoids, and/or magnet materials 70,72,74 should be sufficient to provide the desired quantization without significantly shifting the hyperfine frequency of the alkali-metal atoms. If desired, a number of magnetic shields (not shown) may be provided about the resonance cell 40 to reduce any magnetic field fluctuations within the surrounding environment that could affect the hyperfine frequency of the alkali-metal atoms.

During operation, orthogonally polarized light 76,78 emitted from each of the laser sources 48,50 is passed through a quarter-wavelength plate 80, which converts the linearly polarized laser light 76,78 into circularly polarized light 84,86 to improve optical pumping efficiency. In addition to the quarter-wavelength plate 80, other optical modifier elements may be used to alter the characteristics of the laser radiation in a desired manner. Examples of such elements may include, but are not limited to, beam expanders, collimators, attenuators, focusing lenses, or the like. Such elements may be formed either integrally with the laser sources 48,50, or as separate elements therefrom.

Figure 4:
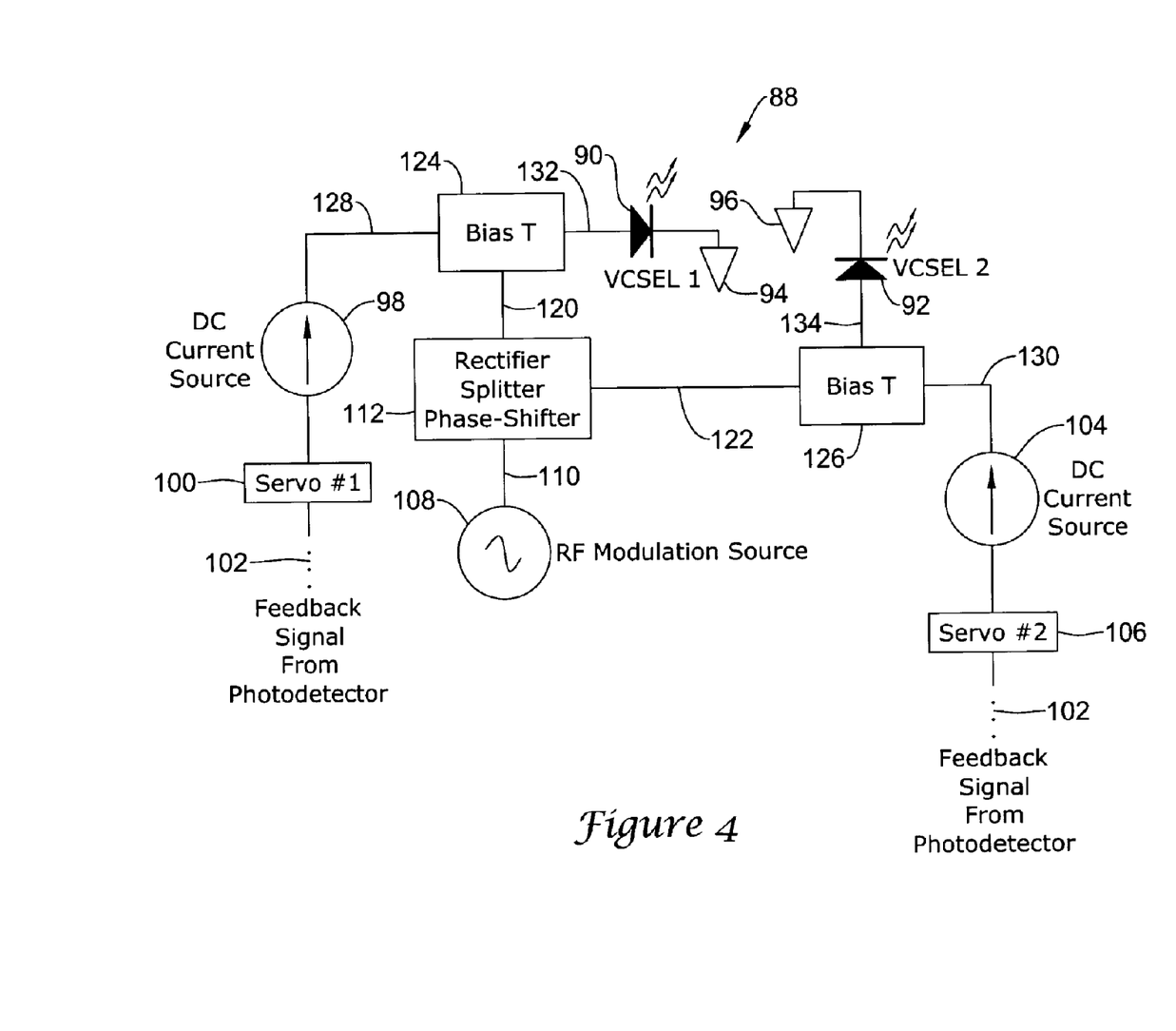
FIG. 4 is a diagrammatic view showing an illustrative optical pumping circuit for effecting CPT enhancing time-dependent polarization radiation using a rectified RF signal.

Turning now to FIG. 4, an illustrative optical pumping circuit 88 for effecting CPT enhancing time-dependent polarization radiation using a rectified RF signal will now be described. As shown in FIG. 4, two orthogonally polarized VCSEL's 90,92 can each be configured to produce linearly polarized light at a specific wavelength of interest, but modulated 180° out-of-phase with respect to each other. A first VCSEL 90 of the system 88, for example, can be configured to produce linearly polarized light 94 for use in pumping out the lower hyperfine multiplet of the alkali-metal atoms. The second VCSEL 92, in turn, can be maintained at a 180° modulated phase difference from the first VCSEL 90, and can be configured to produce linearly polarized laser light 96 for use in pumping out the upper hyperfine multiplet of the alkali-metal atoms. The alternating orthogonally polarized light 94,96 outputted by the VCSEL's 90,92 can then be converted to left and right-handed circularly polarized light via a quarter-wave plate and then delivered into a vapor cavity containing the alkali-metal and buffer gas admixture, similar to that described above with respect to FIG. 3. As can be understood in greater detail below, such process can be used to optically pump nearly all of the alkali-metal atoms into their 0-0 superposition or "dark" state, which can be detected as dark lines in the transmission spectrum using a photodetector or other suitable detection means.

A first DC current source 98 can be configured to enable laser emission from the first VCSEL source 90 at a specific wavelength corresponding to the carrier wavelength of the alkali-metal atoms. In those embodiments where rubidium 85 or 87 isotopes are used for the source of resonance atoms, for example, the first DC current source 98 can be configured to center the radiation output of the first VCSEL 90 at a carrier wavelength of approximately 794.97 nm, which corresponds to the hyperfine frequency of the rubidium isotopes. The carrier wavelength will typically vary, however, for other types of alkali-metals such as cesium 133, sodium 23, or potassium 39. In some embodiments, a first servo mechanism 100 can be used to maintain the current supplied to the first VCSEL 90 at a constant intensity, thus locking the VCSEL 90 at precisely the carrier wavelength of the alkali-metal atoms. The first servo mechanism 100 can be configured to control the current supplied to the first VCSEL 90 using, for example, a feedback signal 102 received from the photodetector. Other means for locking the VCSEL 90 at the carrier wavelength can be used, however, depending on the application.

A second DC current source 104 can be configured to enable laser emission from the second VCSEL 92, also at a wavelength corresponding to the carrier wavelength of the alkali-metal atoms. A second servo mechanism 106 can be used to maintain the current supplied to the second VCSEL 92 at a constant intensity vis-à-vis the feedback signal 102 from the photodetector, thus locking the second VCSEL 92 at precisely the carrier wavelength of the alkali-metal atoms. Typically, the second servo mechanism 106 will be configured to maintain the laser emission from the second VCSEL 92 at the exact same wavelength as that of the first VCSEL 90 such that both VCSEL's 90,92 are centered on the same carrier wavelength. For a resonance source of rubidium 87 atoms, for example, the first and second VCSEL's 90,92 are both maintained at a wavelength of 794.97 nm, which corresponds to the hyperfine frequency of the rubidium isotopes. The first and second servo mechanisms 100,106 can be configured to maintain the VCSEL's 90,92 at other desired wavelengths, however, depending on the source of resonant alkali-metal atoms used.

Figure 5:
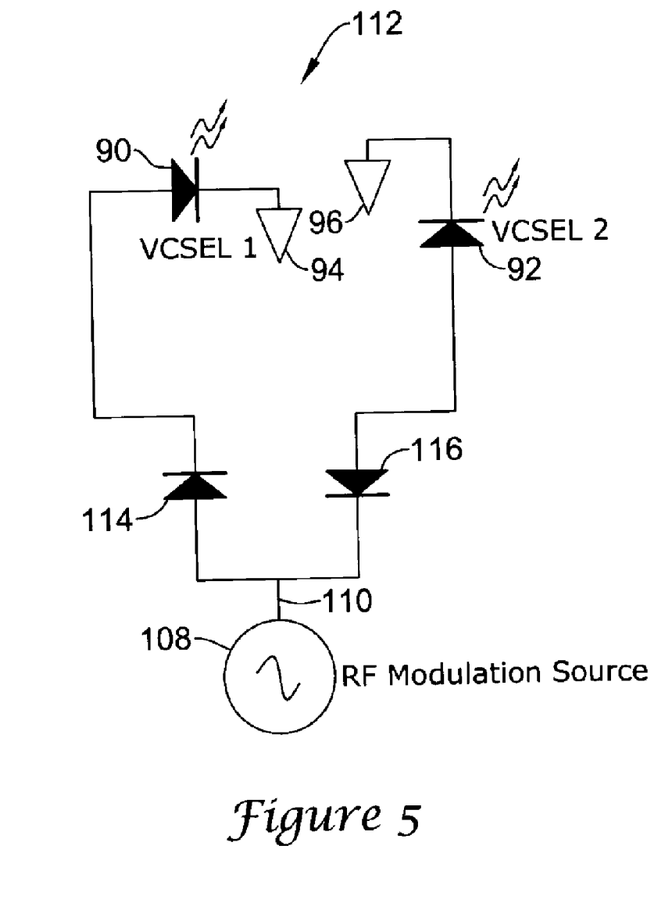
FIG. 5 is a schematic view showing an illustrative rectifier circuit for splitting, rectifying, and phase-shifting the RF modulated signal of FIG. 4.

An RF modulation source 108 can be utilized to provide RF modulation to each of the VCSEL's 90,92, inducing two first order sidebands on the carrier separated by the hyperfine transition of the alkali-metal atoms. To alternate the linearly polarized light 94,96 emitted from each of the VCSEL's 90,92, the RF modulated signal 110 outputted by the RF modulation source 108 can be fed to a rectifier circuit 112 adapted to split, half-wave rectify, and phase-shift the RF modulated signal 110. The rectification of the RF modulated signal 110 can be accomplished using any number of suitable rectification circuits known in the art. In one illustrative embodiment depicted in FIG. 5, for example, the RF modulated signal 110 can be split into two separate signals, rectified, and phase-shifted using two anti-parallel diodes 114,116. It should be understood, however, that rectification of the RF modulated signal 110 can be accomplished using other circuits and/or techniques, if desired.

Referring back to FIG. 4, once the RF modulated signal 110 has been split, rectified and phase-shifted via the rectification circuit 112, the two resultant rectified and phase-shifted signals 120 and 122 are then fed to a respective current injector 124,126 such as a Bias T power injector. A first rectified signal 120 outputted by the circuit 112, for example, can be fed to a first current injector 126, which includes various components for modulating the DC carrier current signal 128 while also preventing backflow of the first rectified signal 120 to the DC current source 98. A second rectified signal 122 outputted by the circuit 112, in turn, can be fed to the second current injector 126, which injects the DC carrier current signal 130 with the second rectified signal 122. The output signals 132,134 from each of the current injectors 124,126 can then be fed to a corresponding VCSEL 90,92, causing the VCSEL's 90,92 to produce alternating pulses of orthogonally polarized light 94,96.

Because the intensity of the DC current signals 128,130 outputted by the DC current sources 98,104 are constant vis-à-vis the first and second servo mechanisms 100,106, it is only necessary to rectify and phase-shift the RF modulated signal 110 outputted from the RF modulation source 108. This rectification and phase-shifting of only the RF modulating signal 110 and not the DC current signals 128,130 obviates the need for intensity modulators and/or interferometers typically employed by more conventional CPT optical pumping systems. In addition, because it is unnecessary to amplitude modulate the VCSEL's 90,92 in an on and off manner, there are no deleterious effects on the output wavelength of the VCSEL's 90,92. In some applications, the elimination of these components and/or steps allows the optical pumping system to be fabricated on a smaller scale more consistent with semiconductor practice. In MEMS-type devices, for example, the elimination of these components may permit the optical pumping system to be produced on the same wafer as other MEMS components, reducing the overall size of the MEMS device.

FIGS. 6A-6D are graphs showing the amplitude of the RF output signals 120,122 for several illustrative waveforms outputted by the RF modulation source 108 of FIG. 4. As can be seen in a first graph in FIG. 6A, a square-wave RF modulated signal 110 outputted by the RF modulation source 108 produces two alternating half-wave rectified signals 120,122, indicated, respectively, by solid and dashed lines in FIG. 6A. Such alternating half-wave rectified signals may be formed, for example, using the two anti-parallel diodes 114,116 depicted in the illustrative rectification circuit 112 of FIG. 5, although other techniques are possible.

Figure 6A:
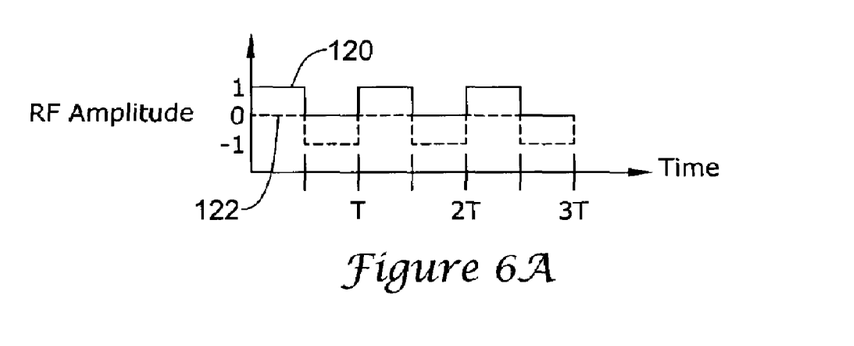
FIGS. 6A-6D are graphs showing the amplitude of the rectified RF signals for the illustrative optical pumping circuit of FIG. 4 using several illustrative waveforms.
Figure 6B:
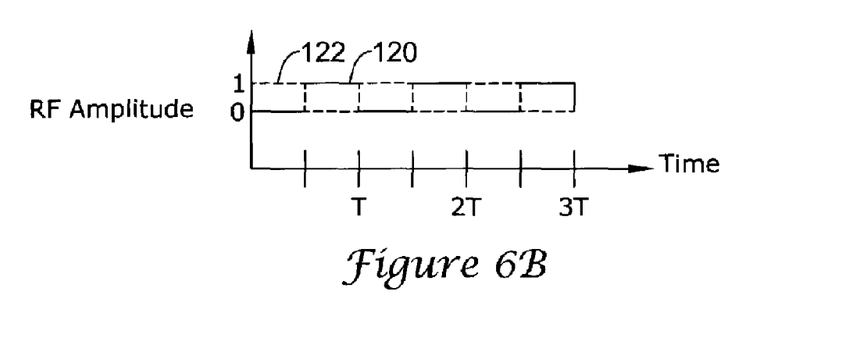
Figure 6C:
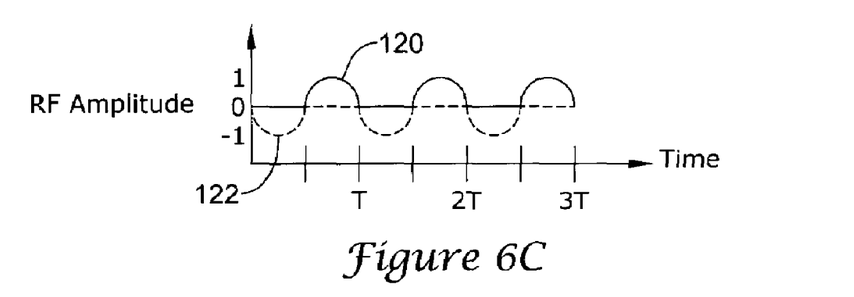

During the first half of each cycle from 0<t<T/2, the signal 120 for the first VCSEL 90 is on whereas the signal 122 for the second VCSEL 92 is reduced to near zero. Conversely, during the second half of each cycle, the signal 120 for the first VCSEL 90 is reduced to near zero whereas the signal 122 for the second VCSEL 92 is on. This alternating configuration between the two pulsed signals 120,122 repeats for each cycle T, generating alternating orthogonally polarized light that can be used to induce CPT resonances in the alkali-metal atoms, as described above.

Figure 6D:
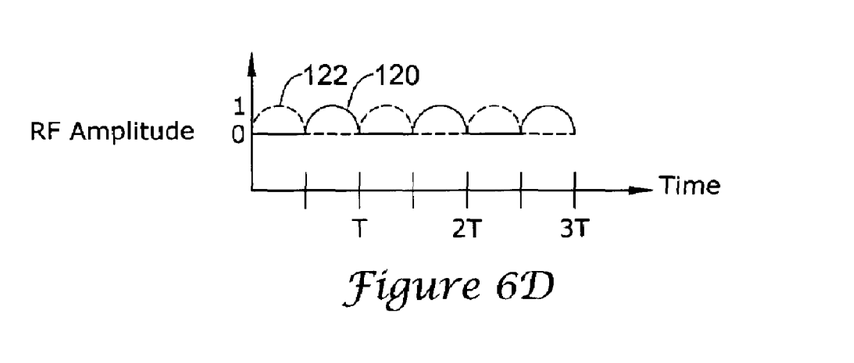

In the illustrative graph shown in FIG. 6A, the rectification of the square-wave RF modulated signal 110 produces alternating signal pulses 120,132 having both positive and negative values. In an alternative embodiment shown FIG. 6B, however, rectification of the RF modulated signal 110 can be accomplished such that the resultant signal pulses 120,122 have a positive only amplitude. As further illustrated in FIGS. 6C and 6D, the RF modulated signal 110 outputted by the RF modulation source 108 can have a sinusoidal or other desired shape with either a positive/negative amplitude (FIG. 6C), or a positive only amplitude (FIG. 6D). Thus, while square-wave and sinusoidal waveforms are shown in the illustrative graphs of FIGS. 6A-6D, it should be understood that other waveforms such as a saw-tooth, clipped sine, etc. could be utilized to induce the desired time-dependent polarization.

Figure 7:
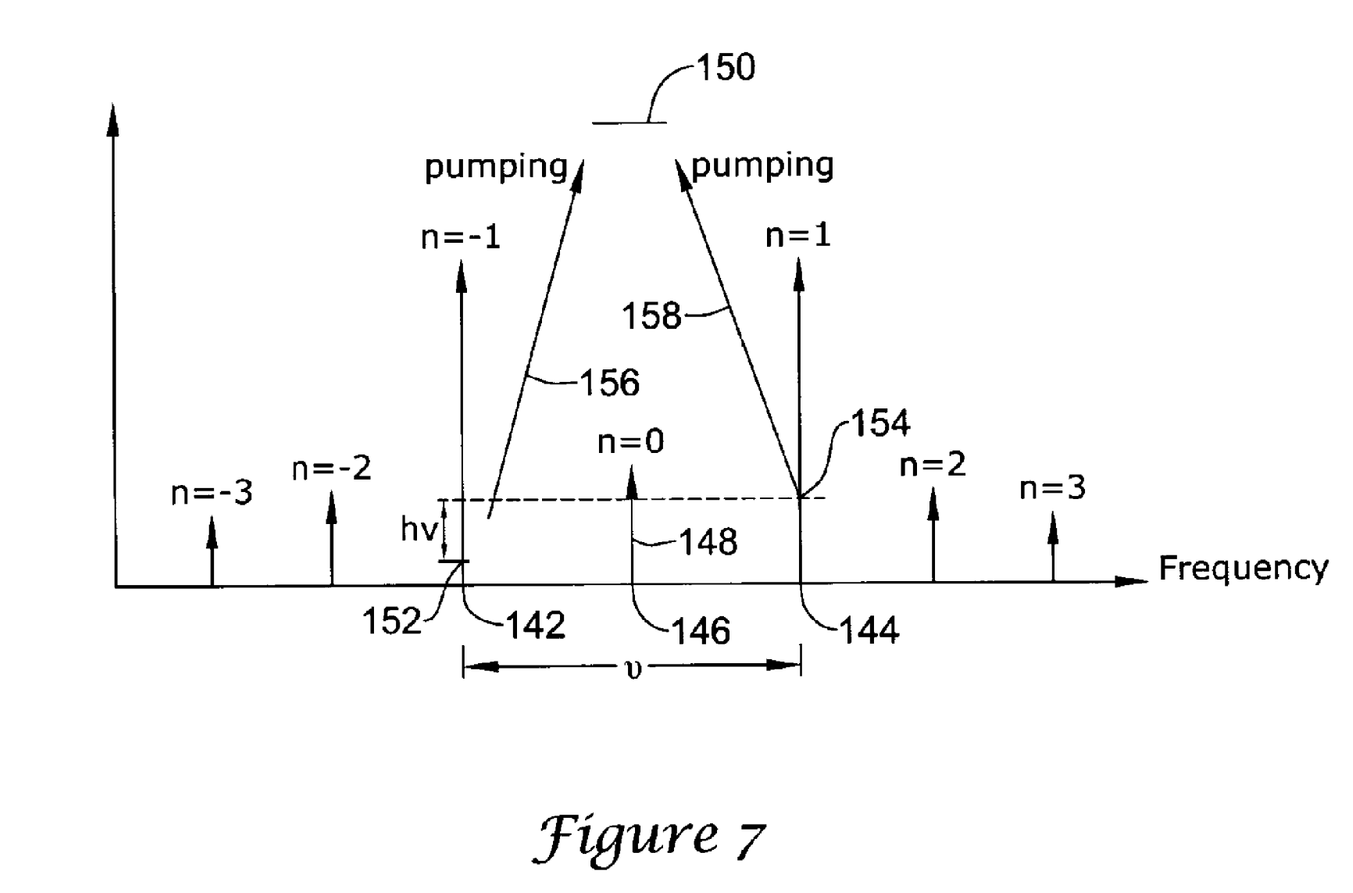
FIG. 7 is a diagrammatic view showing the formation of a populated CPT dark state using the optical pumping system of FIG. 3 and a source or rubidium 87 atoms.

FIG. 7 is a diagrammatic view showing the formation of populated CPT dark states using the illustrative optical pumping system 34 of FIG. 3 and a source or rubidium 87 atoms. As shown in FIG. 7, alternating circularly polarized laser light 84,86 directed into the vapor cavity 42 containing the admixture of rubidium 87 atoms and one or more buffer gasses excites the atoms to a hyperfine frequency v of about 6,835 GHz, producing two 3.4 GHz sidebands 142,144 on either side of the carrier wavelength 146 corresponding to the separation energy of the hyperfine levels F=±1, m=0 and F=±2, m=0. At this excitation frequency, a hyperfine transition in the atomic ensemble occurs, causing the atoms to move between a hyperfine ground state level 148 (i.e. $5^2S_{1/2}$, F=1, m=0) to a transition energy level 150 (i.e. $5^2P_{1/2}$), which stimulates the production of electromagnetic radiation. As soon as the atoms which participate in the stimulated emission arrive at the lower and upper hyperfine levels 152,154 (i.e. F=1), they are optically pumped and transported back into the excited states, as indicated generally by arrows 156 and 158.

During optical pumping 156,158, an interference takes place as a result of the coherence of the optical excitation produced by the two coherence radiation fields from the two sidebands 142,144. Such interference causes a phenomenon of population trapping in the hyperfine ground state 148 wherein no transitions take place to the "P" state 150 and where a strong coherence is created at the ground state hyperfine transition frequency v. When this occurs, the atoms in the superposition state absorb very little light from the pulses of left and right circularly polarized light 84,86. Atoms in any other state, in turn, will be excited by the pulsed light 84,86, and thus no matter their initial state, will eventually be pumped into the superposition state or "dark state" of the system.

Having thus described the several embodiments of the present invention, those of skill in the art will readily appreciate that other embodiments may be made and used which fall within the scope of the claims attached hereto. Numerous advantages of the invention covered by this document have been set forth in the foregoing description. It will be understood that this disclosure is, in many respects, only illustrative. Changes can be made with respect to various elements described herein without exceeding the scope of the invention.

What is claimed is:

1. A push-pull optical pumping system for inducing coherence population trapping resonances in alkali-metal atoms, the optical pumping system comprising:
   a resonance cell including a vapor cavity containing a source of alkali-metal atoms and one or more buffer gasses;
   a laser assembly adapted to produce alternating orthogonally polarized light at a carrier wavelength of the alkali-metal atoms;
   at least one DC current source adapted to output a carrier current signal for inducing laser emission from the laser assembly at said carrier wavelength, the at least one DC current source operatively connected to a servo mechanism for maintaining the intensity of the carrier current signal at a constant;
   an RF modulation source adapted to output an RF modulated signal for modulating the carrier current signal outputted from the at least one DC current source;
   a means for rectifying and phase-shifting the RF modulated signal outputted from the RF modulation source; and
   a means for sensing the transmission of laser light through the vapor cavity.

2. The push-pull optical pumping system of claim 1, wherein said laser assembly comprises two orthogonally polarized laser sources.

3. The push-pull optical pumping system of claim 2, wherein said two orthogonally polarized laser sources are VCSEL's.

4. The push-pull optical pumping system of claim 3, wherein each of the two orthogonally polarized laser sources includes an array of VCSEL's.

5. The push-pull optical pumping system of claim 1, wherein said laser assembly comprises a single dual-polarized laser source.

6. The push-pull optical pumping system of claim 1, wherein said means for rectifying and phase-shifting the RF modulated signal includes two antiparallel diodes.

7. The push-pull optical pumping system of claim 1, further comprising a means for converting the alternating orthogonally polarized light emitted from the laser assembly into circularly polarized light.

8. The push-pull optical pumping system of claim 7, wherein said means for converting the alternating orthogonally polarized light into circularly polarized light includes a quarter-wavelength plate.

9. The push-pull optical pumping system of claim 1, wherein said optical pumping system is a microelectromechanical optical pumping system.

10. A push-pull optical pumping system for inducing coherence population trapping resonances in alkali-metal atoms, the optical pumping system comprising:
    a resonance cell including a vapor cavity containing a source of alkali-metal atoms and one or more buffer gasses;
    a first laser source configured to produce polarized light for pumping out a lower hyperfine multiplet of the alkali-metal atoms;
    a second laser source configured to produce light polarized orthogonally with respect to the polarized light produced by the first laser source for pumping out an upper hyperfine multiplet of the alkali-metal atoms;
    a first DC current source configured to output a carrier current signal for inducing laser emission from the first laser source at a carrier wavelength of the alkali-metal atoms, the first DC current source operatively connected to a first servo mechanism for maintaining the intensity of the carrier current signal supplied to the first laser source at a constant;
    a second DC current source configured to output a carrier current signal for inducing laser emission from the second laser source at the carrier wavelength of the alkali-metal atoms, the second DC current source operatively connected to a second servo mechanism for maintaining the intensity of the carrier current signal supplied to the second laser source at a constant;
    an RF modulation source for modulating the carrier current signals outputted from the first and second DC current sources and inducing sidebands on the carrier current signals separated by the hyperfine transition of the alkali-metal atoms;
    a means for rectifying and phase-shifting the RF modulated signal outputted from the RF modulation source such that said second laser source is modulated 180 degrees out-of-phase with the first laser source; and
    a means for sensing the transmission of laser light through the vapor cavity.

11. The push-pull optical pumping system of claim 10, wherein said first and second laser sources are VCSEL's.

12. The push-pull optical pumping system of claim 10, wherein each of the first and second laser sources includes an array of VCSEL's.

13. The push-pull optical pumping system of claim 10, wherein said means for rectifying and phase-shifting the RF modulated signal includes two antiparallel diodes.

14. The push-pull optical pumping system of claim 10, further comprising a means for converting alternating orthogonally polarized light emitted from the first and second laser sources into circularly polarized light.

15. The push-pull optical pumping system of claim 14, wherein said means for converting the alternating orthogonally polarized light into circularly polarized light includes a quarter-wavelength plate.

16. The push-pull optical pumping system of claim 10, wherein said optical pumping system is a microelectromechanical optical pumping system.

17. A method of optically pumping alkali-metal atoms contained in a vapor cavity using CPT resonances, the method comprising the steps of:
    providing a first laser source adapted to emit a first laser beam into the vapor cavity;
    providing a second laser source adapted to emit a second laser beam into the vapor cavity;
    injecting a DC carrier current signal into each of the first and second laser sources for inducing laser emission from each laser source at the carrier wavelength of the alkali-metal atoms, each carrier current signal having a substantially constant intensity;

providing an RF modulation source adapted to output an RF modulated signal;

rectifying and phase-shifting the RF modulated signal to produce two rectified and phase-shifted signals modulated 180 degrees out-of-phase with respect to each other;

injecting the rectified and phase-shifted signals into the carrier current signals to produce alternating orthogonally polarized light from the first and second laser sources, thereby inducing sidebands on the carrier current signals separated by the hyperfine transition of the alkali-metal atoms;

converting the alternating orthogonally polarized light emitted from the first and second laser sources into alternating left and right-handed circularly polarized light;

optically pumping the alkali-metal atoms with the alternating left and right-handed circularly polarized light; and detecting the transmission of laser light through the vapor cavity.

18. The method of claim 17, wherein said first and second laser sources are VCSEL's.

19. The method of claim 17, wherein the DC carrier current signal applied to each laser source is locked in a servo loop.

20. The method of claim 17, wherein said step of optically pumping the alkali-metal atoms with the alternating left and right-handed circularly polarized light includes the steps of:

optically pumping a lower hyperfine multiplet of the alkali-metal atoms using left-handed circularly polarized light from the first laser source; and optically pumping an upper hyperfine multiplet of the alkali-metal atoms using right-handed circularly polarized light from the second laser source.

* * * * *